United States Patent
Boehm et al.

(10) Patent No.: US 12,283,538 B2
(45) Date of Patent: Apr. 22, 2025

(54) MOLDED SEMICONDUCTOR PACKAGE HAVING AN EMBEDDED INLAY

(71) Applicant: Infineon Technologies AG, Neubiberg (DE)

(72) Inventors: Marcus Boehm, Thalmassing (DE); Michael Fuegl, Neumarkt (DE); Ludwig Heitzer, Falkenfels (DE); Stefan Woetzel, Erfurt (DE)

(73) Assignee: Infineon Technologies AG, Neubiberg (DE)

( * ) Notice: Subject to any disclaimer, the term of this patent is extended or adjusted under 35 U.S.C. 154(b) by 382 days.

(21) Appl. No.: 17/740,413

(22) Filed: May 10, 2022

(65) Prior Publication Data
US 2023/0369177 A1     Nov. 16, 2023

(51) Int. Cl.
*H01L 23/495*     (2006.01)
*H01L 21/48*      (2006.01)
(Continued)

(52) U.S. Cl.
CPC .... *H01L 23/49506* (2013.01); *H01L 21/4825* (2013.01); *H01L 21/565* (2013.01);
(Continued)

(58) Field of Classification Search
CPC ........... H01L 23/49506; H01L 23/3107; H01L 23/3135; H01L 23/49524; H01L 23/49562;
(Continued)

(56) References Cited

U.S. PATENT DOCUMENTS 9,437,528 B1 * 9/2016 Gong ................. H01L 23/49541
2016/0168359 A1 * 6/2016 Kleyer ............... C09K 11/0883
534/15
(Continued)

FOREIGN PATENT DOCUMENTS

JP      2004163722 A  *  6/2004

OTHER PUBLICATIONS

Monemayor, Carlos. "Exploring the Performance of Silicone Gels at High and Low Temperature" IPC Apex Expo. (Year: 2011).*
(Continued)

*Primary Examiner* — Peniel M Gumedzoe
*Assistant Examiner* — Douglas Yap
(74) *Attorney, Agent, or Firm* — Murphy, Bilak & Homiller, PLLC (57) ABSTRACT

A molded semiconductor package includes: a mold compound; a metal substrate partly embedded in the mold compound; at least one first metal lead partly embedded in the mold compound; an inlay embedded in the mold compound, the inlay comprising a semiconductor die embedded in an electrically insulating body, a first metal structure attached to a first side of the semiconductor die, and a second metal structure attached to a second side of the semiconductor die; and a metal clip at least partly embedded in the mold compound and connecting the second metal structure to the at least one first metal lead. The semiconductor die has a maximum junction temperature higher than a glass transition temperature of the mold compound, the electrically insulating body has a glass transition temperature at or above the maximum junction temperature of the semiconductor die, and the metal substrate is attached to the first metal structure.

17 Claims, 6 Drawing Sheets

(51) Int. Cl.
 *H01L 21/56* (2006.01)
 *H01L 23/31* (2006.01)
(52) U.S. Cl.
 CPC ...... *H01L 23/3107* (2013.01); *H01L 23/3135* (2013.01); *H01L 23/49524* (2013.01); *H01L 23/49562* (2013.01); *H01L 23/49568* (2013.01)
(58) Field of Classification Search
 CPC ........... H01L 23/49568; H01L 23/3677; H01L 23/051; H01L 21/4825; H01L 21/565
 See application file for complete search history.

(56) References Cited

U.S. PATENT DOCUMENTS

| | | | |
|---|---|---|---|
| 2017/0236819 A1* | 8/2017 | Kanai | H01L 23/24 257/77 |
| 2019/0139866 A1* | 5/2019 | Kuraya | H01L 24/29 |
| 2022/0130773 A1* | 4/2022 | Pun | H01L 23/4952 |

OTHER PUBLICATIONS

English translation of JP-2004163722-A (Year: 2004).*
"Automotive 1200 V, 20 A, silicon carbide power Schottky diode", STPSC20H12-Y, Datasheet, DS11830—Rev 4, pp. 1-15.
"Würth Elektronik eiSos GmbH & Co. KG—Data Sheet Rev. 2.0", Magl3C Power Module Variable Step Down Regulator Module, Jul. 2018, pp. 1-56.

* cited by examiner

MOLDED SEMICONDUCTOR PACKAGE HAVING AN EMBEDDED INLAY

BACKGROUND

Wide bandgap semiconductor technologies such as SiC and GaN allow operational junction temperatures well beyond the theoretical limit of silicon technology. However, wide bandgap semiconductor devices are typically packaged using materials such as mold compounds and joining materials designed for silicon operating conditions only. As such, high temperature chip (die) features are not fully leveraged to date for wide bandgap semiconductor devices, limiting the advantages of wide bandgap semiconductor technologies over silicon technology.

Die size is often reduced to make wide bandgap semiconductor technologies more cost-competitive with silicon technology. However, die size reduction is limited for wide bandgap semiconductor technologies due to a corresponding increase in junction temperature which is beyond the thermal limit for many standard mold compounds used to package semiconductor devices. Most standard mold compounds are designed for silicon technology and thus suitable for junction temperatures lower than what is supported by wide bandgap semiconductor technologies. Accordingly, wide bandgap semiconductor technologies are not fully leveraged when standard mold compounds are used as the packaging material. Furthermore, some standard joining materials such as AuSn diffusion bonds have severe reliability issues when used in conjunction with high junction temperature wide bandgap semiconductor technologies.

Hence, there is a need for an improved molded semiconductor package design suitable for the high junction temperatures supported by wide bandgap semiconductor technologies.

SUMMARY

According to an embodiment of a molded semiconductor package, the molded semiconductor package comprises: a mold compound; a metal substrate partly embedded in the mold compound; at least one first metal lead partly embedded in the mold compound; an inlay embedded in the mold compound, the inlay comprising a semiconductor die embedded in an electrically insulating body, a first metal structure attached to a first side of the semiconductor die, and a second metal structure attached to a second side of the semiconductor die; and a metal clip at least partly embedded in the mold compound and connecting the second metal structure to the at least one first metal lead, wherein the semiconductor die has a maximum junction temperature higher than a glass transition temperature of the mold compound, wherein the electrically insulating body has a glass transition temperature at or above the maximum junction temperature of the semiconductor die, wherein the metal substrate is attached to the first metal structure.

According to an embodiment of a method of producing a molded semiconductor package, the method comprises: providing an inlay that comprises a semiconductor die embedded in an electrically insulating body, a first metal structure attached to a first side of the semiconductor die, and a second metal structure attached to a second side of the semiconductor die; attaching a metal substrate to the first metal structure; connecting the second metal structure to at least one first metal lead by a metal clip; and molding the inlay, the metal substrate, and the at least one first metal lead such that the metal substrate is partly embedded in the mold compound, the at least one first metal lead is partly embedded in the mold compound, and the inlay is embedded in the mold compound, wherein the semiconductor die has a maximum junction temperature higher than a glass transition temperature of the mold compound, wherein the electrically insulating body has a glass transition temperature at or above the maximum junction temperature of the semiconductor die, wherein the first metal structure has a greater metal volume than the second metal structure.

According to another embodiment of a molded semiconductor package, the molded semiconductor package comprises: a mold compound; a metal substrate partly embedded in the mold compound; and an inlay embedded in the mold compound, the inlay comprising a semiconductor die embedded in an electrically insulating body, a first metal structure attached to a first side of the semiconductor die, and a second metal structure attached to a second side of the semiconductor die, wherein the electrically insulating body has a higher glass transition temperature than the mold compound, wherein the metal substrate is attached to the first metal structure to form a primary thermal pathway for dissipating heat from the semiconductor die such that a temperature along an interface between the mold compound and the electrically insulating body does not exceed a glass transition temperature of the mold compound during normal operation of the semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6A illustrates a side perspective view of the package prior to molding and FIG. 68 shows the same perspective view as FIG. 6A but after molding, according to an embodiment.

DETAILED DESCRIPTION

The embodiments described herein provide a molded semiconductor package that is suitable for high junction temperatures supported by wide bandgap semiconductor technologies. The molded semiconductor package includes an inlay embedded in the package mold compound. The inlay includes a semiconductor die embedded in an electrically insulating body. The semiconductor die has a maximum junction temperature higher than a glass transition temperature of the package mold compound. The electrically insulating body of the inlay has a glass transition temperature at or above the maximum junction temperature of the semiconductor die. The inlay also has capabilities for heat spreading and heat dissipation to prevent excessive heating of the package mold compound during normal operation of the semiconductor die.

Described next, with reference to the figures, are exemplary embodiments of the molded semiconductor package and related methods of production. The inlay features described herein may be used interchangeably unless otherwise expressly stated.

Figure 1A:
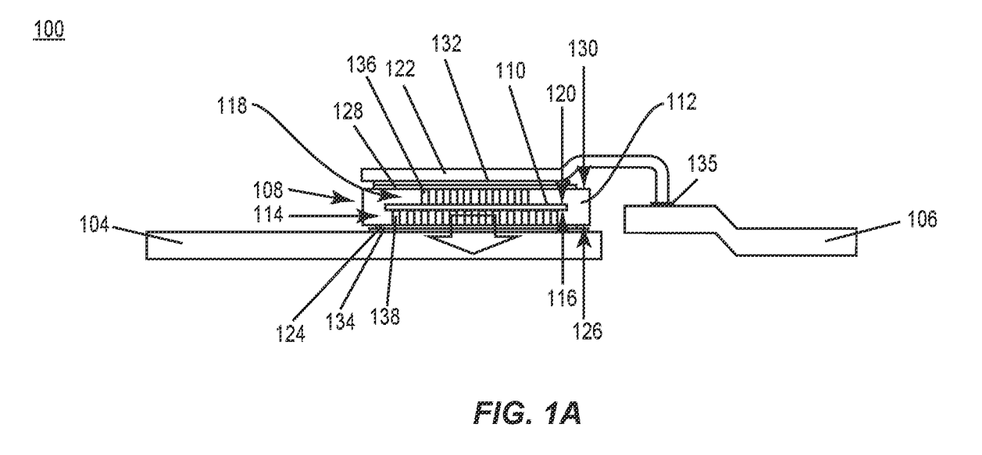
FIG. 1A illustrates a cross-sectional view of a molded semiconductor package with high temperature inlay before molding and FIG. 1B illustrates the same cross-sectional view of FIG. 1A but after molding, according to an embodiment.
Figure 1B:
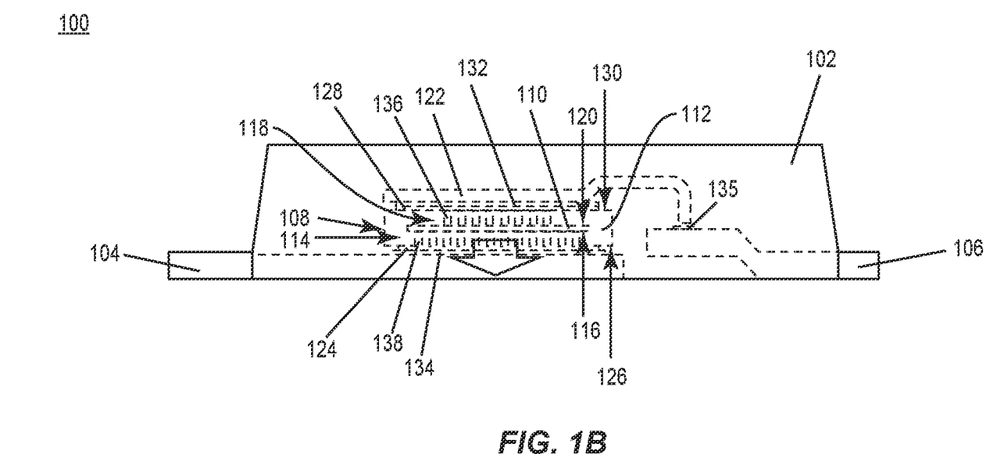

FIG. 1A illustrates a cross-sectional view of a molded semiconductor package 100 before molding and FIG. 1B illustrates the same cross-sectional view of the molded semiconductor package 100 after molding, according to an embodiment. The molded semiconductor package 100 may form part of a power electronics circuit for use in various power applications such as in a DC/AC inverter, a DC/DC converter, an AC/DC converter, a DC/AC converter, an AC/AC converter, a multi-phase inverter, an H-bridge, etc.

The molded semiconductor package 100 includes a mold compound 102, a metal substrate 104 partly embedded in the mold compound 102, at least one first metal lead 106 partly embedded in the mold compound 102, and an inlay 108 embedded in the mold compound 102. The package 100 may be a leaded or leadless package. That is, the end of the leads 106 may protrude from one or more side faces of the mold compound 102 (leaded package) or may not protrude from any side face of the mold compound 102 (leadless package).

The metal substrate 104 and each first metal lead 106 of the molded semiconductor package 100 may be part of a lead frame, for example. The inlay 108 includes at least one semiconductor die 110 embedded in an electrically insulating body 112, a first metal structure 114 attached to the first side 116 of the semiconductor die 110, and a second metal structure 118 attached to the second side 120 of the semiconductor die 110. The first structure and second metal structures 114, 118 are electrically and thermally connected to the metal structures 124 and 118 located at the inlay surfaces 126 and 130, respectively. A metal clip 122 at least partly embedded in the mold compound 102 connects the second metal structure 118 to the at least one first metal lead 106. The metal clip 122, the metal substrate 104, and each first metal lead 106 may be pure Cu (copper) structures, at least in-part, with other metal (combinations) such as Cu structures or other structurable, laminate-, leadframe- or ceramic-based substrates.

The semiconductor die 110 included in the inlay 108 has a maximum junction temperature Tj higher than the glass transition temperature Tg_mc of the mold compound 102. The electrically insulating body 112 of the inlay 108 has a glass transition temperature Tg_in at or above the maximum junction temperature Tj of the semiconductor die 110. The metal substrate 104 is attached to the first metal structure 114 of the inlay 108 to form a primary thermal pathway for dissipating heat from the semiconductor die 110 such that a temperature along the interface between the package mold compound 102 and the inlay electrically insulating body 112 does not exceed the glass transition temperature Tg_mc of the package mold compound 102 during normal operation of the semiconductor die 110. FIGS. 1A and 1B indicate the primary thermal pathway by a downward facing arrow. FIG. 1B indicates the interface between the package mold compound 102 and the electrically insulating body 112 of the inlay 108 by dashed lines.

The heat spreading and heat dissipation capabilities of the inlay 108 prevent excessive heating of the package mold compound 102 during normal operation of the semiconductor die 110. The heat spreading and heat dissipation capabilities via the primary thermal pathway may be further enhanced by designing the first metal structure 114 of the inlay 108 to have a greater metal volume than the second metal structure 118 of the inlay 108, Accordingly, the glass transition temperature Tg_mc of the mold compound 102 is not exceeded during normal operation of the semiconductor die 110. The temperature of the mold compound 102 may exceed the glass transition temperature Tg_mc during short circuit or other fault conditions, however.

In one embodiment, the maximum junction temperature Tj of the semiconductor die 110 is at least 200° C., e.g., up to 215° C. and the glass transition temperature Tg_mc of the mold compound 102 is at most 200° C., e.g., at most 175° C. For example, the semiconductor die 110 may be a SiC die such as a SiC power MOSFET (metal-oxide-semiconductor field-effect transistor) die or a GaN die such as a GaN HEMT (high-electron mobility transistor) die and the mold compound 102 may be an epoxy-based mold compound having a glass transition temperature Tg_mc equal to or less than 200° C., e.g., equal to or less than 175° C. The inlay 108 may include other types of semiconductor dies. For example, the semiconductor die 110 may be a Si power MOSFET die, an IGBT (insulated-gate bipolar transistor) die, a JFET (junction filed-effect transistor) die, a Si or SiC power diode die, etc.

As previously explained herein, the semiconductor die 110 embedded in the inlay 108 has a maximum junction temperature Tj higher than the glass transition temperature Tg_mc of the mold compound 102 and the electrically insulating body 112 of the inlay 108 has a glass transition temperature Tg_in at or above the maximum junction temperature Tj of the semiconductor die 110. In one embodiment, the package mold compound 102 is an epoxy-based mold compound having a glass transition temperature Tg_mc less than 175° C. and the electrically insulating body 112 of the inlay 108 is a silicone-based mold compound having a glass transition temperature Tg_in greater than 175° C. In another embodiment, the package mold compound 102 comprises an epoxy resin and the electrically insulating body 112 of the inlay 108 comprises a bismaleimide resin. The bismaleimide resin may be bismaleimide triazine, for example. Bismaleimide triazine resins have a glass transition temperature up to 300° C. or even higher. Still other high temperature (Tg_in>175° C., e.g., Tg_in >200° C., e.g., 175<Tg_in≤300° C.) materials may be used for the electrically insulating body 112 of the inlay 108.

In FIGS. 1A and 1B, the first metal structure 114 includes a metallization 124 such as plated Cu, Cu foil, etc. to which the metal substrate 104 is attached at a first side 126 of the inlay 108. The second metal structure 118 includes a metallization 128 such as plated Cu, Cu foil, etc. to which the metal clip 122 is attached at a second side 130 of the inlay 108 opposite the first side 126. The metal clip 122 may be attached to the metallization 124 at the second side 130 of the inlay 108 by a joining material 132 such as solder, diffusion solder, AuSn diffusion bonds, adhesive, glue, Cu (copper) seed layer, etc. The metal substrate 104 similarly may be attached to the metallization 124 at the first side 126 of the inlay 108 by a joining material 134 such as solder, diffusion solder, AuSn diffusion bonds, adhesive, glue, electroplating seed layer, etc. In one embodiment, the metal clip 122 and the at least one first metal lead 106 are monolithically formed, e.g., as part of a single lead frame or clip frame. In another embodiment, the metal clip 122 and the at least one first metal lead 106 are separate and distinct parts that are attached together by a joining material 135 such as solder, diffusion solder, AuSn diffusion bonds, adhesive, glue, Cu (copper) seed layer, etc.

In FIGS. 1A and 1B, the first metal structure 114 of the inlay 108 includes first metal vias 136 and the second metal structure 118 of the inlay 108 includes second metal vias 138. The first vias 136 and the second vias 138 may be formed by Cu plating of respective openings in the electrically insulating body 112 of the inlay 108, for example. The first metal vias 136 vertically extend from the second side 120 of the semiconductor die 110 to the metallization 128 at the second side 130 of the inlay 108. The second metal vias 138 vertically extend from the first side 116 of the semiconductor die 110 to the metallization 124 at e first side 126 of the inlay 108.

Figure 4:
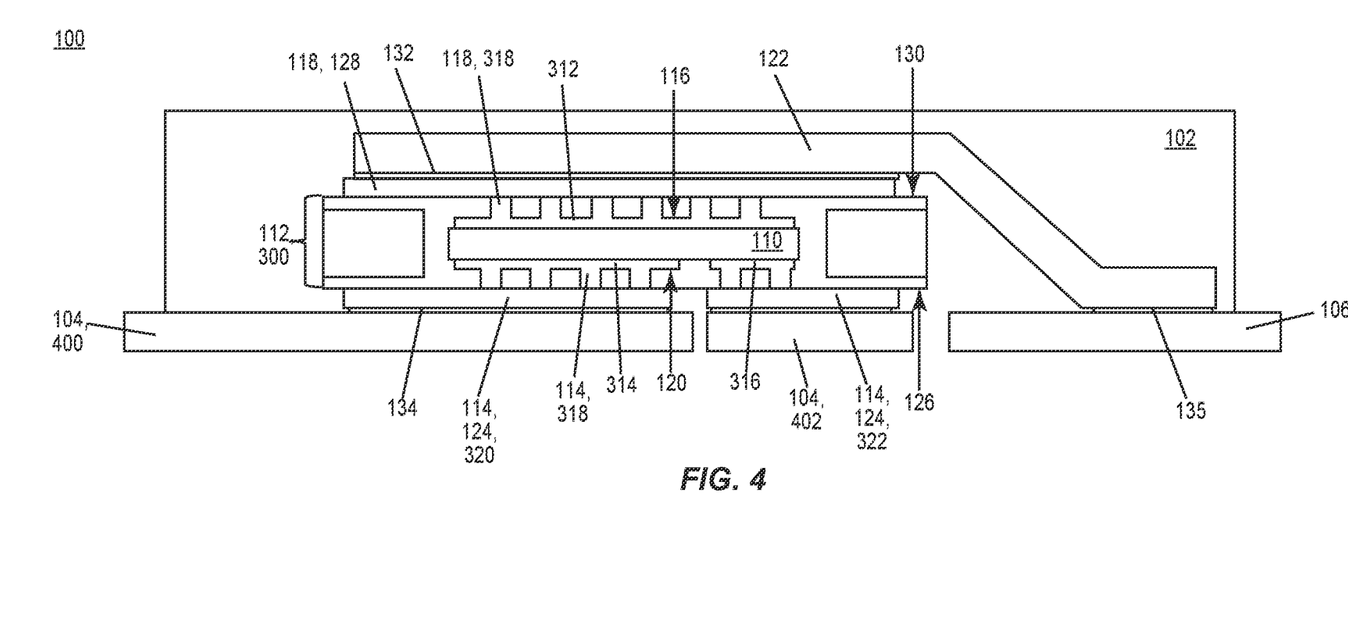
FIG. 4 illustrates a cross-sectional view of the molded semiconductor package after the inlay shown in FIG. 3 is embedded in the mold compound of the package.

In one embodiment, there are more first metal vias 136 than second metal vias 138 such that the first metal structure 114 of the inlay 108 has a greater metal volume than the second metal structure 118 of the inlay 108, enhancing the primary thermal pathway that includes the first metal structure 114 of the inlay 108 and the metal substrate 104 attached to the first metal structure 114. In another embodiment, the first metal vias 136 and the second metal vias 138 have symmetrical layouts. In another embodiment, the inlay configuration is flipped with the inlay metallization 124 facing the metal clip 122, e.g., as shown in FIG. 4. The metal clip 122 could be exposed to the topside of the package, thereby directing the primary thermal path upwards as is the case for a topside cooled architecture. Such a configuration minimizes the thermal load on the system board (not shown), thereby permitting the system board to be made from lower cost PCB (printed circuit board) materials. By tuning the Cu content of the second metal structure 118, e.g., as described above, and by partly exposing the metal substrate 104, the thermal load on the system board can be modulated by changing the package design elements.

Figure 2A:
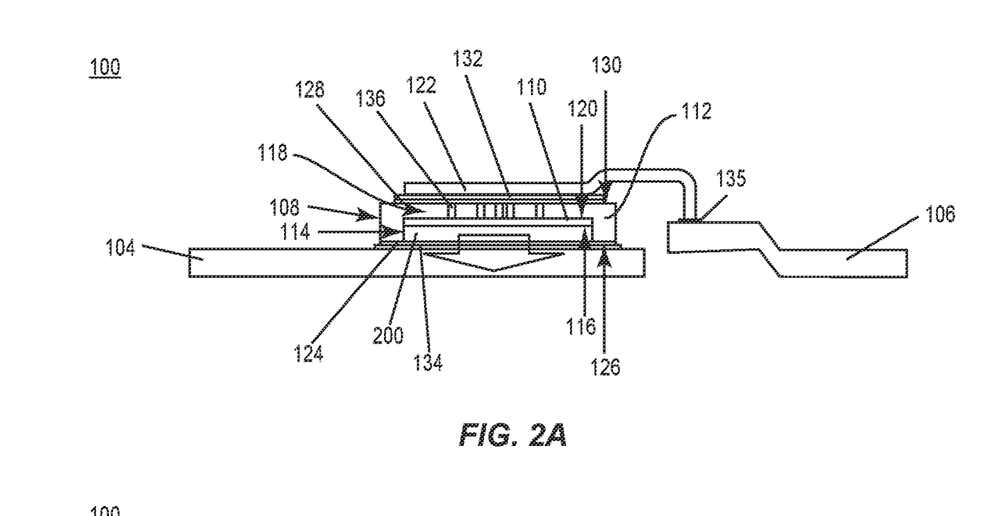
FIG. 2A illustrates a cross-sectional view of the molded semiconductor package before molding and FIG. 2B illustrates the same cross-sectional view as FIG. 2A but after molding, according to an embodiment.
Figure 2B:
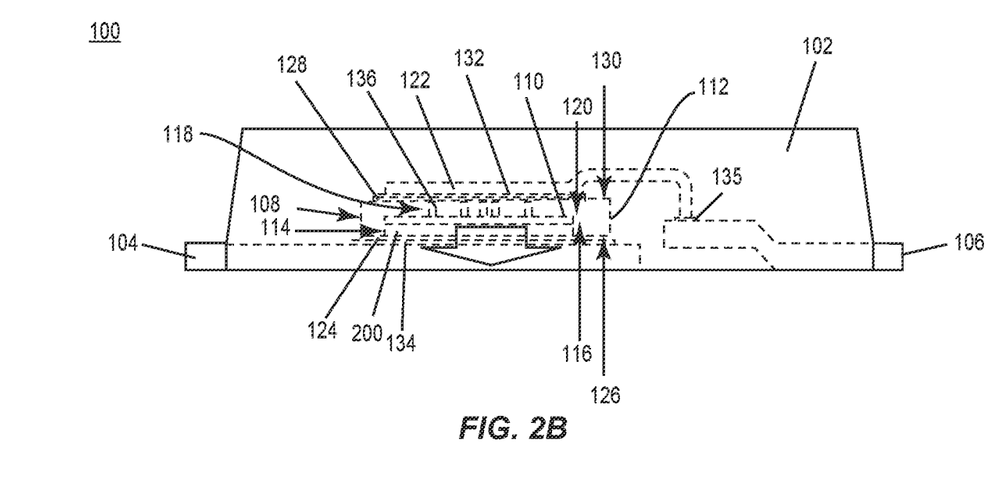

FIG. 2A illustrates a cross-sectional view of the molded semiconductor package 100 before molding and FIG. 2B illustrates the same cross-sectional view of the molded semiconductor package 100 but after molding, according to another embodiment. In FIGS. 2A and 2B, the first metal structure 114 of the inlay 108 includes a contiguous metal block 200 such as a Cu block and the second metal structure 118 of the inlay 108 includes metal vias 136 such as Cu vias. The contiguous metal block 200 may be solid in nature or structured with vertical features to reduce effect of CTE (coefficient of thermal expansion) mismatch between the semiconductor die 110 and the first metal structure 114, and may be an insert placed in an opening in the electrically insulating body 112 of the inlay 108 or formed by plating the opening, for example. According to the embodiment illustrated in FIGS. 2A and 2B, the first metal structure 114 of the inlay 108 has a greater metal volume than the second metal structure 118 of the inlay 108, further enhancing the primary thermal pathway at the drain(collector)-side of the die 110.

The second metal structure 118 of the inlay 108 also may be a contiguous metal block, but such a configuration would enhance the source(emitter)-side thermal pathway to the semiconductor die 110. In some cases, it may not be desirable to enhance the source(emitter)-side thermal pathway to the semiconductor die 110 since the package mold compound 102 may contact this side of the die 110 as shown in FIGS. 1B and 2B. In these cases, metal vias 136 may be preferred at the source(emitter)-side of the die 110 to provide the corresponding electrical connections (e.g., source/emitter and gate connections) without enhancing the source (emitter)-side thermal pathway and thereby ensuring the glass transition temperature $Tg\_mc$ of the package mold compound 102 is not exceeded during normal operation of the semiconductor die 110.

Figure 3:
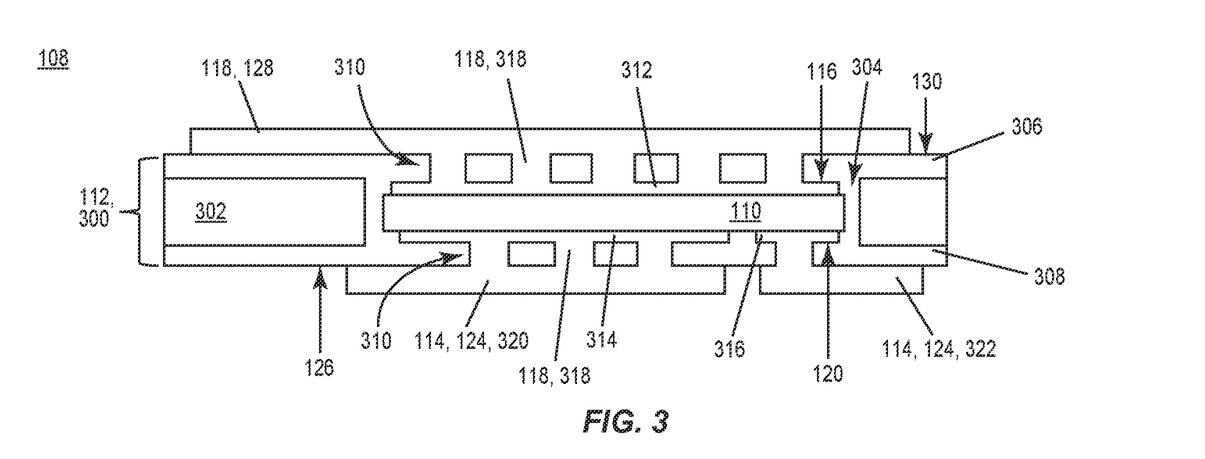
FIG. 3 illustrates a cross-sectional view of the inlay included in the molded semiconductor package.

FIG. 3 illustrates a cross-sectional view of the inlay 108 embedded in the mold compound 102 of the molded semiconductor package 100. According to this embodiment, the electrically insulating body 112 of the inlay 108 is a laminate 300 such as a PCB. The laminate 300 may include a core or a semi-solid adhesive 302 having a glass transition temperature $Tg\_in$ greater than the glass transition temperature $Tg\_mc$ of the package mold compound 102 and at or above the maximum junction temperature $Tj$ of the semiconductor die 110. For example, the core or semi-solid adhesive 302 may comprise a bismaleimide resin such as bismaleimide triazine. The semiconductor die 110 is placed in an opening 304 in the core/semi-solid adhesive 302.

Upper and lower prepreg layers 306, 308 each comprising a composite material made from pre-impregnated fibers and a partially cured polymer matrix form a stacked structure with the core/semi-solid adhesive 302. The upper and lower prepreg layers 306, 308 have a glass transition temperature $Tg\_pre$ greater than the glass transition temperature $Tg\_mc$ of the package mold compound 102 and at or above the maximum junction temperature $Tj$ of the semiconductor die 110. For example, the upper and lower prepreg layers 306, 308 may comprise a bismaleimide resin such as bismaleimide triazine. Heat and pressure are applied to the stacked structure during a lamination process, melting and curing epoxy resin in the core/semi-solid adhesive 302 and the prepreg layers 306, 308 to form the electrically insulating body 112 of the inlay 108.

Openings 310 are formed in the electrically insulating body 112 of the inlay 108 to expose part of the first and second sides 116, 120 of the die 110, respectively. The semiconductor die 110 may be a vertical device in that the primary current flow path is between the first and second sides 116, 120 of the die 110. The semiconductor die 110 instead may be a lateral device in that the primary current flow path is along the second side 120 of the die 110. Additional types of semiconductor dies may be included in the molded power semiconductor package 100, such as power diode dies, logic dies, controller dies, gate driver dies, etc.

In the case of the semiconductor die 110 being a vertical device as shown in FIG. 3, the semiconductor die 110 has a first load or power terminal 312 at the first side 116 of the die 110 and a second load or power terminal 314 at the second side 120 of the die 110. For a vertical transistor device, the first load or power terminal 312 may be a drain (MOSFET/JFET) or collector (IGBT) terminal and the second load or power terminal 314 may be a source (MOSFET/JFET) or emitter (IGBT) terminal. A gate terminal 316 may be provided at the same side 120 of the die 110 as the source/emitter terminal 314. For a vertical diode device, the first load or power terminal 312 may be a cathode terminal and the second load or power terminal 314 may be an anode terminal. No gate terminal 316 is provided for a diode device.

In the case of the semiconductor die 110 being a lateral device, all terminals are disposed at the second side 120 of the die 110. For a lateral transistor device, this means the drain/collector terminal 312, the source/emitter terminal 314, and the gate terminal 316 are each provided at the second side 116 of the semiconductor die 110. For a lateral diode device, the cathode terminal 312 and the anode terminal 314 are both provided at the second side 116 of the semiconductor die 110. The first side 116 of the semiconductor die 110 may or may not be metallized if the die 110 is a lateral device. The die terminals 312, 314, 316 shown in FIG. 1 are not visible in FIGS. 1A-1B and 2A-2B.

A plating or other process such as Cu paste printing, metal powder bed fusion, etc. is used to fill the openings 310 in the electrically insulating body 112 of the inlay 108 with metal 318 to connect the terminals 312, 314, 316 of the semiconductor die 110 with the metallization 124, 128 at the corresponding side 126, 130 of the inlay 108. In the case of copper, electrochemical deposition (ECD) may be used as the plating process to form the metal vias 318. Other types of plating or deposition processes may be used to fill the openings 310 in the electrically insulating body 112 of the inlay 108 with an electrically conductive material 318.

The metallization 124, 128 at the first and second sides 126, 130 of the inlay 108 may be formed by plating, e.g., ECD. The metallization 124, 128 at the first and second sides 126, 130 of the inlay 108 instead may be formed by applying a copper layer/foil to the upper and lower prepreg layers 306, 308 during the lamination process and subsequently structuring one or both of the copper layers/foils to support current flow and signal routing to and from the semiconductor die 110. In the case of a vertical transistor device, the metallization 124 at the first side 126 of the inlay 108 may be structured into a first part 320 that provides a source/emitter connection to the source/emitter terminal 314 of the semiconductor die 110 and into a second part 322 that provides a gate connection to the gate terminal 316 of the die 110. The metallization 128 at the second side 130 of the inlay 108 may or may not be structured. In the case of a lateral transistor device, the metallization 124 at the first side 126 of the inlay 108 may be structured to enable the source/emitter, drain/collector, and gate connections to the semiconductor die 110 and the metallization 128 at the second side 130 of the inlay 108 may or may not be omitted. The inlay 108 may include more layers of metal vias 318 and metallizations 124, 128 than what is shown in FIG. 3.

In FIG. 3, the metal vias 318 between the second side 120 of the die 110 and the first side 126 of the inlay 108 connect the metallization 124 of the first metal structure 114 to the second side 120 of the semiconductor die 110. The metal vias 318 between the first side 116 of the die 110 and the second side 130 of the inlay 108 connect the metallization 128 of the second metal structure 118 to the first side 116 of the semiconductor die 110. There may be more metal vias 318 between the second side 120 of the semiconductor die 110 and the second side 130 of the inlay 108 than between the first side 116 of the semiconductor die 110 and the first side 126 of the inlay 108, to further enhance the primary thermal pathway at the drain-side of the die 110.

The metal vias 318 at both sides 116, 120 of the semiconductor die 110 may or may not have symmetrical layouts. In another embodiment, the metal vias 318 between the second side 120 of the die 110 and the second side 130 of the inlay 108 may be replaced by a contiguous metal block, e.g., as shown in FIG. 2B but with the position of the contiguous metal block 200 flipped to the opposite side of the die 110 in FIG. 3.

The orientation of the semiconductor die 110 in FIG. 3 is source(emitter)-down whereas the orientation is drain(collector)-down in FIGS. 1A-1B and 2A-2B. The orientation of the semiconductor die 110 in FIG. 3 may be flipped such that the semiconductor die 110 has a drain(collector)-down configuration, e.g., as shown in FIGS. 1A-1B and 2A-2B. In this case, the metal vias 318 between the first side 116 of the die 110 and the first side 126 of the inlay 108 connect the metallization 124 of the first metal structure 114 to the first side 116 of the semiconductor die 110 and the metal vias 318 between the second side 120 of the die 110 and the second side 130 of the inlay 108 connect the metallization 128 of the second metal structure 118 to the second side 120 of the semiconductor die 110. In this configuration, there may be more metal vias 318 between the first side 116 of the semiconductor die 110 and the first side 126 of the inlay 108 than between the second side 120 of the semiconductor die 110 and the second side 130 of the inlay 108 to further enhance the primary thermal pathway at the drain-side of the die 110.

In some cases, more than one semiconductor die 110 may be embedded in the electrically insulating body 112 of the inlay 108. For example, the inlay 108 may include one or more half bridges each comprising a series-connected pair of power transistor dies. One power transistor die of a half bridge may be inserted in the inlay 108 with a drain (collector)-down configuration and the other power transistor die may be inserted in the inlay 108 with a source (emitter)-down configuration, to facilitate the switching node connection between the half bridge pair of power transistor dies. The inlay embodiments described herein support both a drain(collector)-down die configuration, e.g., as shown in FIGS. 1A-1B and 2A-28, and a source(emitter)-down mounting configuration, e.g., as shown in FIG. 3.

FIG. 4 illustrates a cross-sectional view of the molded semiconductor package 100 after the inlay shown in FIG. 3 is embedded in the mold compound 102 of the package 100. The semiconductor die 110 has a source(emitter)-down configuration in FIG. 4 but instead may have a drain (collector)-down configuration, as explained above. In the case of the source(emitter)-down die configuration, the metal substrate 104 may be divided into a first part 400 and a second part 402. The first part 400 of the metal substrate 104 is connected to the source(emitter) terminal 314 of the semiconductor die 110 through the corresponding metal vias 318 and the first part 320 of the metallization 124 of the first metal structure 114 of the inlay 108. The second part 402 of the metal substrate 104 is connected to the gate terminal 316 of the semiconductor die 110 through the corresponding metal vias 318 and the second part 322 of the metallization 124 of the first metal structure 114 of the inlay 108. Also as explained above, the metal vias 318 that connect the drain (collector) terminal 312 of the semiconductor die 110 to the metallization 128 of the second metal structure 118 of the inlay 108 may be replaced by a contiguous metal block to further enhance the primary thermal pathway at the drain-side of the die 110.

As explained above, the inlay configuration is flipped in FIG. 4 such that the inlay metallization 124 faces the metal clip 122. The metal clip 122 may be exposed at the topside of the package, thereby directing the primary thermal path upwards as is the case for a topside cooled architecture to minimize the thermal load on the system board (not shown). By tuning the Cu content of the second metal structure 118, e.g., as described above, and by partly exposing the metal substrate 104, the thermal load on the system board can be modulated by changing the package design elements.

Figure 5:
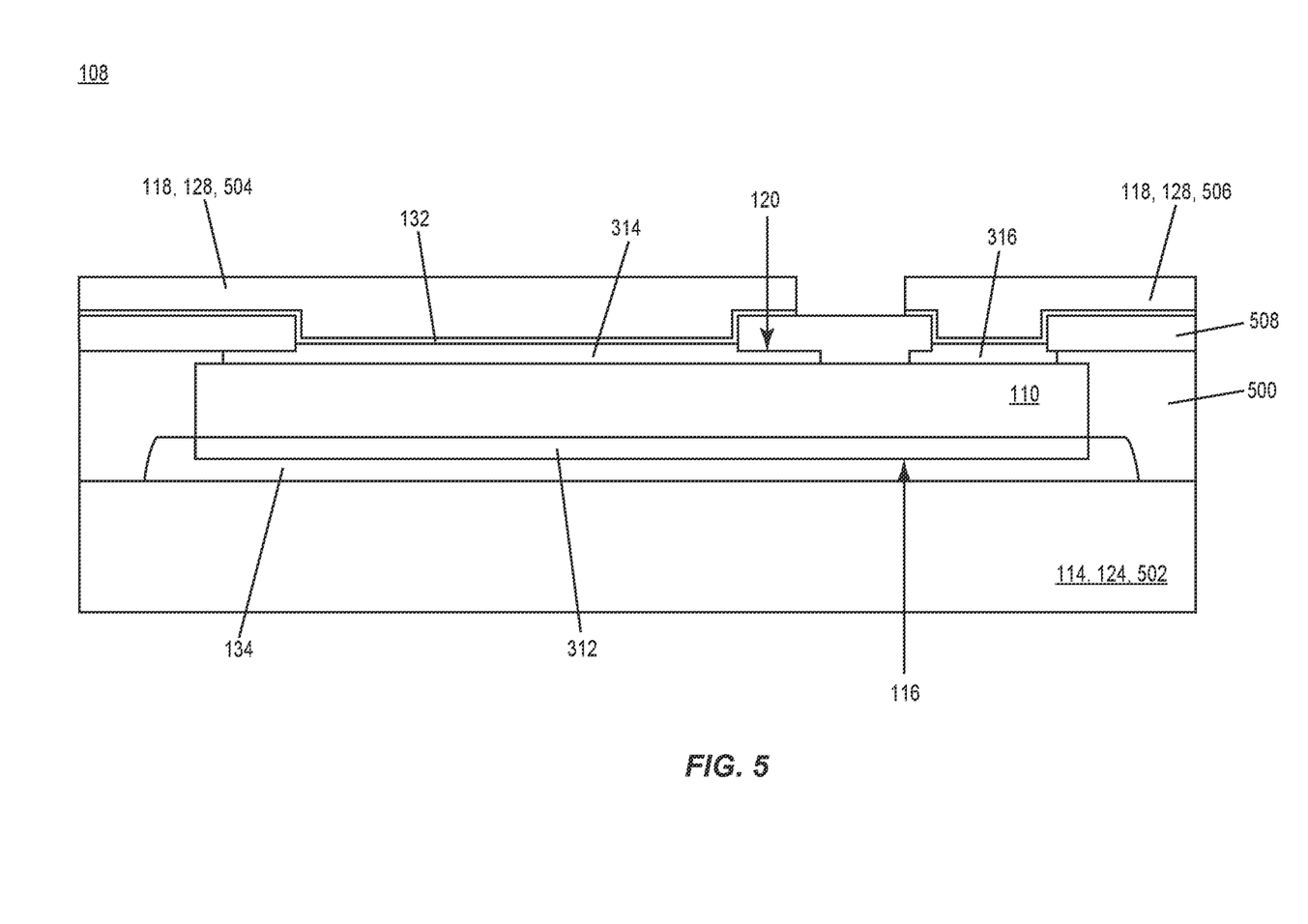
FIG. 5 illustrates a cross-sectional view of another embodiment of the inlay embedded in the mold compound of the molded semiconductor package.

FIG. 5 illustrates a cross-sectional view of another embodiment of the inlay 108 embedded in the mold compound 102 of the molded semiconductor package 100. According to this embodiment, the electrically insulating body 112 of the inlay 108 is a mold compound 500 having a higher glass transition temperature Tg_mc2 than the package mold compound 102. For example, the package mold compound 102 may comprise an epoxy resin and the inlay mold compound 500 may comprise a bismaleimide resin such as bismaleimide triazine.

The first metal structure 124 of the inlay 108 may be a contiguous metal block 502 attached to the first side 116 of the semiconductor die 110 by a first joining material 134 such as solder, diffusion solder, AuSn diffusion bonds, adhesive, glue, electroplating seed layer, etc. The metallization 128 of the second metal structure 118 of the inlay 108 may be a plated metal layer such as a plated Cu layer attached to the second side 120 of the semiconductor die 110 by a second joining material 132 such as solder, diffusion solder, AuSn diffusion bonds, adhesive, glue, electroplating seed layer, etc.

The semiconductor die 110 has a drain(collector)-down configuration in FIG. 5 but instead may have a source (emitter)-down configuration, as explained above. In the case of the drain(collector)-down die configuration, the first metal structure 124 of the inlay 108 may be a contiguous layer attached to the drain(collector) terminal 312 of the semiconductor die 110 or omitted altogether in the case of a lateral device. The metallization 128 of the second metal structure 118 of the inlay 108 may be divided into a first part 504 and a second part 506. The first part 504 of the metallization 128 of the second metal structure 118 may be attached to the source(emitter) terminal 314 of the semiconductor die 110 and the second part 504 of the metallization 128 of the second metal structure 118 may be attached to the gate terminal 316 of the semiconductor die 110.

In one embodiment, the metallization 126 of the first metal structure 116 of the inlay 108 is a structured Cu lead frame which may be formed by stamping, chemical etching, laser cutting, etc. The inlay 108 may be produced by attaching the semiconductor die 110 to the Cu lead frame, molding the structure, and then forming one or more openings in the inlay mold compound 500, e.g., by laser or mechanical drilling to enable contact formation, e.g., by Cu plating. The metallization 128 of the second metal structure 118 may then be formed by electrochemical deposition, for example. An isolation material 508 such as a solder mask may be used to define the regions to be plated.

Figure 6A:
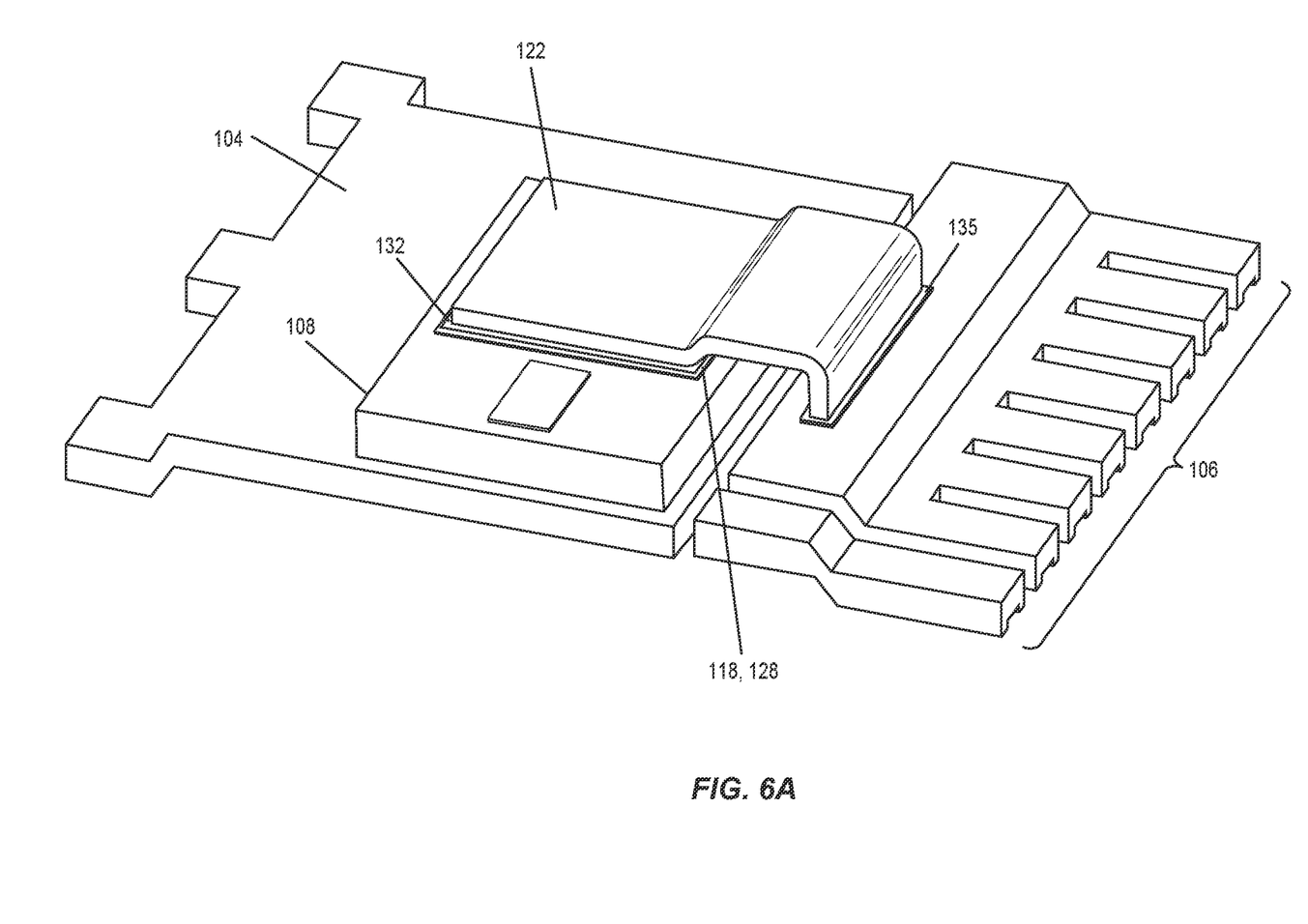
Figure 6B:
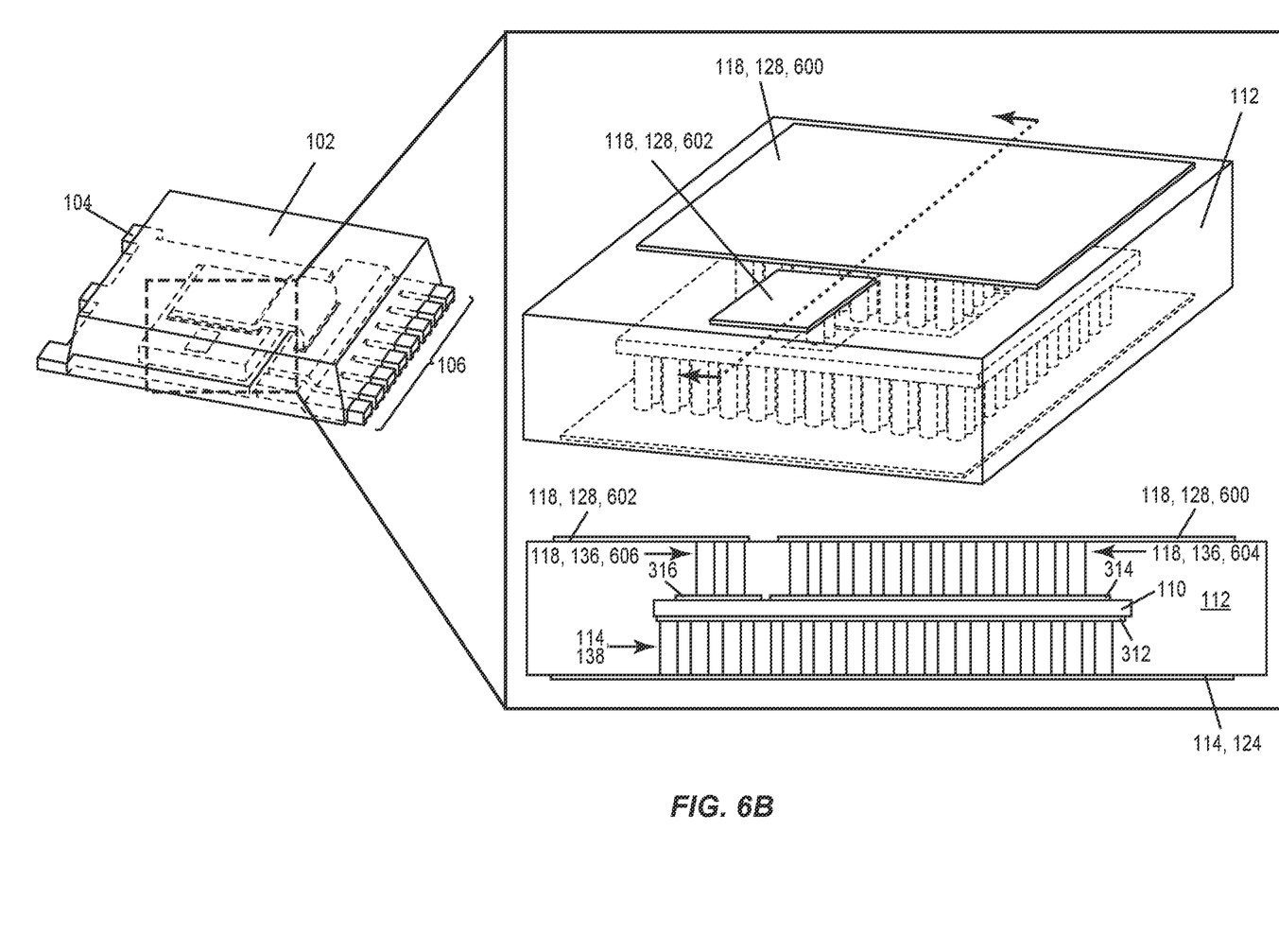

FIG. 6A illustrates a side perspective view of the package 100 prior to molding and FIG. 6B shows the same perspective view as FIG. 6A but after molding, according to an embodiment. FIG. 6B also shows enlarged perspective and cross-sectional views of the inlay 108. The orientation of the semiconductor die 110 in FIGS. 6A and 68 is drain(collector)-down and the primary thermal pathway is at the backside of the package 100, The metallization 124 of the first metal structure 114 of the inlay 108 may be connected to the drain(collector) terminal 312 of the semiconductor die 110 by the metal vias 138 of the first metal structure 114, e.g., as shown in FIG. 6B or by a contiguous metal block, e.g., as shown in FIG. 2B.

The metallization 128 of the second metal structure 118 of the inlay 108 is divided into a first part 600 and a second part 602 in FIGS. 6A-6B. The first part 600 of the metallization 128 of the second metal structure 118 is connected to the source(emitter) terminal 314 of the semiconductor die 110 by a first group 604 of the metal vias 136 of the second metal structure 118 of the inlay 108. The second part 602 of the metallization 128 of the second metal structure 118 is connected to the gate terminal 316 of the semiconductor die 110 by a second group 606 of the metal vias 136 of the second metal structure 118. The orientation of the semiconductor die 110 instead may be source(emitter)-down with the primary thermal pathway at the frontside of the package 100, e.g., as shown in FIGS. 3 and 4.

Although the present disclosure is not so limited, the following numbered examples demonstrate one or more aspects of the disclosure.

Example 1. A molded semiconductor package, comprising: a mold compound; a metal substrate partly embedded in the mold compound; at least one first metal lead partly embedded in the mold compound; an inlay embedded in the mold compound, the inlay comprising a semiconductor die embedded in an electrically insulating body, a first metal structure attached to a first side of the semiconductor die, and a second metal structure attached to a second side of the semiconductor die; and a metal clip at least partly embedded in the mold compound and connecting the second metal structure to the at least one first metal lead, wherein the semiconductor die has a maximum junction temperature higher than a glass transition temperature of the mold compound, wherein the electrically insulating body has a glass transition temperature at or above the maximum junction temperature of the semiconductor die, wherein the metal substrate is attached to the first metal structure.

Example 2. The molded semiconductor package of example 1, wherein the first metal structure has a greater metal volume than the second metal structure.

Example 3. The molded semiconductor package of example 1 or 2, wherein the first metal structure comprises a plurality of first metal vias, wherein the second metal structure comprises a plurality of second metal vias, and wherein there are more first metal vias than second metal vias.

Example 4. The molded semiconductor package of any of example 1 through 3, wherein the first metal structure and the second metal structure have symmetrical layouts.

Example 5. The molded semiconductor package of example 1 or 2, wherein the first metal structure comprises a contiguous metal block, and wherein the second metal structure comprises a plurality of metal vias.

Example 6. The molded semiconductor package of any of examples 1 through 5, wherein the maximum junction temperature of the semiconductor die is at least 200° C., and wherein the glass transition temperature of the mold compound is at most 200° C.

Example 7. The molded semiconductor package of any of examples 1 through 6, wherein the semiconductor die is a SiC or GaN die, and wherein the mold compound is an epoxy-based mold compound having a glass transition temperature equal to or less than 200° C.

Example 8. The molded semiconductor package of any of examples 1 through 7, wherein the mold compound is an epoxy-based mold compound having a glass transition temperature less than 175° C., and wherein the electrically insulating body is a silicone-based mold compound having a glass transition temperature greater than 175° C.

Example 9. The molded semiconductor package of any of examples 1 through 7, wherein the mold compound comprises an epoxy resin, and wherein the electrically insulating body comprises a bismaleimide resin.

Example 10. The molded semiconductor package of example 9, wherein the bismaleimide resin is bismaleimide triazine.

Example 11. The molded semiconductor package of any of examples 1 through 7, wherein the electrically insulating body is a laminate.

Example 12. The molded semiconductor package of example 11, wherein the first metal structure comprises a metal layer connected to the first side of the semiconductor die by a plurality of first vias extending through first openings in the laminate, and wherein the second metal structure comprises a metal layer connected to the second side of the semiconductor die by a plurality of second vias extending through second openings in the laminate.

Example 13. The molded semiconductor package of example 12, wherein the plurality of first vias and the plurality of second vias have symmetrical layouts.

Example 14. The molded semiconductor package of example 11, wherein the first metal structure comprises a contiguous metal block connected to the first side of the semiconductor die through a single first opening in the laminate, and wherein the second metal structure comprises a metal layer connected to the second side of the semiconductor die by a plurality of vias extending through second openings in the laminate.

Example 15. The molded semiconductor package of any of examples 1 through 7, wherein the electrically insulating body is an additional mold compound having a higher glass transition temperature than the mold compound.

Example 16. The molded semiconductor package of example 15, wherein the first metal structure comprises a contiguous metal block attached to the first side of the semiconductor die by a first joining material, and wherein the second metal structure comprises a metal layer attached to the second side of the semiconductor die by a second joining material.

Example 17. The molded semiconductor package of any of examples 1 through 16, wherein the semiconductor die is a vertical power semiconductor, and wherein both the second side and the first side of the semiconductor die are metalized.

Example 18. A method of producing a molded semiconductor package, the method comprising: providing an inlay that comprises a semiconductor die embedded in an electrically insulating body, a first metal structure attached to a first side of the semiconductor die, and a second metal structure attached to a second side of the semiconductor die; attaching a metal substrate to the first metal structure; connecting the second metal structure to at least one first metal lead by a metal clip; and molding the inlay, the metal substrate, and the at least one first metal lead such that the metal substrate is partly embedded in the mold compound, the at least one first metal lead is partly embedded in the mold compound, and the inlay is embedded in the mold compound, wherein the semiconductor die has a maximum junction temperature higher than a glass transition temperature of the mold compound, wherein the electrically insulating body has a glass transition temperature at or above the maximum junction temperature of the semiconductor die, wherein the first metal structure has a greater metal volume than the second metal structure.

Example 19. A molded semiconductor package, comprising: a mold compound; a metal substrate partly embedded in the mold compound; and an inlay embedded in the mold compound, the inlay comprising a semiconductor die embedded in an electrically insulating body, a first metal structure attached to a first side of the semiconductor die, and a second metal structure attached to a second side of the semiconductor die, wherein the electrically insulating body has a higher glass transition temperature than the mold compound, wherein the metal substrate is attached to the first metal structure to form a primary thermal pathway for dissipating heat from the semiconductor die such that a temperature along an interface between the mold compound and the electrically insulating body does not exceed a glass transition temperature of the mold compound during normal operation of the semiconductor die.

Example 20. The molded semiconductor package of example 19, wherein the first metal structure comprises a plurality of first metal vias, wherein the second metal structure comprises a plurality of second metal vias, and wherein there are more first metal vias than second metal vias.

Example 21. The molded semiconductor package of example 19, wherein the first metal structure comprises a contiguous metal block, and wherein the second metal structure comprises a plurality of metal vias.

Example 22. The molded semiconductor package of any of examples 19 through 21, wherein the mold compound comprises an epoxy resin, and wherein the electrically insulating body comprises a bismaleimide resin.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
   a mold compound;
   a metal substrate partly embedded in the mold compound;
   at least one first metal lead partly embedded in the mold compound;
   an inlay embedded in the mold compound, the inlay comprising a semiconductor die embedded in an electrically insulating body, a first metal structure attached to a first side of the semiconductor die, and a second metal structure attached to a second side of the semiconductor die; and
   a metal clip at least partly embedded in the mold compound and connecting the second metal structure to the at least one first metal lead,
   wherein the semiconductor die has a maximum junction temperature higher than a glass transition temperature of the mold compound,
   wherein the electrically insulating body has a glass transition temperature at or above the maximum junction temperature of the semiconductor die,
   wherein the metal substrate is attached to the first metal structure,
   wherein the first metal structure has a greater metal volume than the second metal structure.

2. The molded semiconductor package of claim 1, wherein the first metal structure comprises a plurality of first metal vias, wherein the second metal structure comprises a plurality of second metal vias, and wherein there are more first metal vias than second metal vias.

3. The molded semiconductor package of claim 1, wherein the first metal structure comprises a contiguous metal block, and wherein the second metal structure comprises a plurality of metal vias.

4. The molded semiconductor package of claim 1, wherein the maximum junction temperature of the semiconductor die is at least 200° C., and wherein the glass transition temperature of the mold compound is at most 200° C.

5. The molded semiconductor package of claim 1, wherein the semiconductor die is a SiC or GaN die, and wherein the mold compound is an epoxy-based mold compound having a glass transition temperature equal to or less than 200° C.

6. The molded semiconductor package of claim 1, wherein the mold compound is an epoxy-based mold compound having a glass transition temperature less than 175° C., and wherein the electrically insulating body is a silicone-based mold compound having a glass transition temperature greater than 175° C.

7. The molded semiconductor package of claim 1, wherein the mold compound comprises an epoxy resin, and wherein the electrically insulating body comprises a bismaleimide resin.

8. The molded semiconductor package of claim 1, wherein the electrically insulating body is a laminate.

9. The molded semiconductor package of claim 8, wherein the first metal structure comprises a metal layer connected to the first side of the semiconductor die by a plurality of first vias extending through first openings in the laminate, and wherein the second metal structure comprises a metal layer connected to the second side of the semiconductor die by a plurality of second vias extending through second openings in the laminate.

10. The molded semiconductor package of claim 8, wherein the first metal structure comprises a contiguous metal block connected to the first side of the semiconductor die through a single first opening in the laminate, and wherein the second metal structure comprises a metal layer connected to the second side of the semiconductor die by a plurality of vias extending through second openings in the laminate.

11. The molded semiconductor package of claim 1, wherein the electrically insulating body is an additional mold compound having a higher glass transition temperature than the mold compound.

12. The molded semiconductor package of claim 11, wherein the first metal structure comprises a contiguous metal block attached to the first side of the semiconductor die by a first joining material, and wherein the second metal structure comprises a metal layer attached to the second side of the semiconductor die by a second joining material.

13. The molded semiconductor package of claim 1, wherein the semiconductor die is a vertical power semiconductor, and wherein both the second side and the first side of the semiconductor die are metalized.

14. The molded semiconductor package of claim 1, wherein the metal clip is exposed from the mold compound at a topside of the molded semiconductor package.

15. A molded semiconductor package, comprising:
a mold compound;
a metal substrate partly embedded in the mold compound; and
an inlay embedded in the mold compound, the inlay comprising a semiconductor die embedded in an electrically insulating body, a first metal structure attached to a first side of the semiconductor die, and a second metal structure attached to a second side of the semiconductor die,
wherein the electrically insulating body has a higher glass transition temperature than the mold compound,
wherein the metal substrate is attached to the first metal structure to form a primary thermal pathway for dissipating heat from the semiconductor die such that a temperature along an interface between the mold compound and the electrically insulating body does not exceed a glass transition temperature of the mold compound during normal operation of the semiconductor die,
wherein the first metal structure comprises a plurality of first metal vias,
wherein the second metal structure comprises a plurality of second metal vias,
wherein there are more first metal vias than second metal vias.

16. The molded semiconductor package of claim 15, wherein the mold compound comprises an epoxy resin, and wherein the electrically insulating body comprises a bismaleimide resin.

17. A molded semiconductor package, comprising:
a mold compound;
a metal substrate partly embedded in the mold compound;
at least one first metal lead partly embedded in the mold compound;
an inlay embedded in the mold compound, the inlay comprising a semiconductor die embedded in an electrically insulating body, a first metal structure attached to a first side of the semiconductor die, and a second metal structure attached to a second side of the semiconductor die; and
a metal clip at least partly embedded in the mold compound and connecting the second metal structure to the at least one first metal lead,
wherein the semiconductor die has a maximum junction temperature higher than a glass transition temperature of the mold compound,
wherein the electrically insulating body has a glass transition temperature at or above the maximum junction temperature of the semiconductor die,
wherein the metal substrate is attached to the first metal structure,
wherein the electrically insulating body is a laminate,
wherein the first metal structure comprises a metal layer connected to the first side of the semiconductor die by a plurality of first vias extending through first openings in the laminate,
wherein the second metal structure comprises a metal layer connected to the second side of the semiconductor die by a plurality of second vias extending through second openings in the laminate.

* * * * *